(12) United States Patent
Hirose

(10) Patent No.: US 10,564,499 B2
(45) Date of Patent: Feb. 18, 2020

(54) DISPLAY DEVICE

(71) Applicant: SEMICONDUCTOR ENERGY LABORATORY CO., LTD., Atsugi-shi, Kanagawa-ken (JP)

(72) Inventor: Atsushi Hirose, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 20 days.

(21) Appl. No.: 15/884,440

(22) Filed: Jan. 31, 2018

(65) Prior Publication Data

US 2018/0149940 A1 May 31, 2018

Related U.S. Application Data

(63) Continuation of application No. 15/585,926, filed on May 3, 2017, now Pat. No. 9,885,932, which is a (Continued)

(30) Foreign Application Priority Data

Dec. 20, 2010 (JP) ................. 2010-282635

(51) Int. Cl.
*G09G 5/00* (2006.01)
*G02F 1/1362* (2006.01)
(Continued)

(52) U.S. Cl.
CPC ...... *G02F 1/136286* (2013.01); *G02F 1/1368* (2013.01); *G02F 1/134309* (2013.01); (Continued)

(58) Field of Classification Search
None
See application file for complete search history.

(56) References Cited

U.S. PATENT DOCUMENTS 4,409,134 A 10/1983 Yamazaki
5,002,367 A * 3/1991 Nicholas ............... G02F 1/1362
174/261
(Continued)

FOREIGN PATENT DOCUMENTS

EP 0317011 A 5/1989
EP 2120089 A 11/2009
(Continued)

OTHER PUBLICATIONS

Taiwanese Office Action (Application No. 100145330) dated Aug. 17, 2015.

(Continued)

*Primary Examiner* — Patrick N Edouard
*Assistant Examiner* — Peijie Shen
(74) *Attorney, Agent, or Firm* — Nixon Peabody LLP; Jeffrey L. Costellia

(57) ABSTRACT

To provide a display device in which parasitic capacitance between wirings can be reduced while preventing increase in wiring resistance. To provide a display device with improved display quality. To provide a display device with low power consumption. A pixel of the liquid crystal display device includes a signal line, a scan line intersecting with the signal line, a first electrode projected from the signal line, a second electrode facing the first electrode, and a pixel electrode connected to the second electrode. Part of the scan line has a loop shape, and part of the first electrode is located in a region overlapped with an opening of the scan line. In other words, part of the first electrode is not overlapped with the scan line.

18 Claims, 8 Drawing Sheets

Related U.S. Application Data continuation of application No. 15/368,969, filed on Dec. 5, 2016, now Pat. No. 9,645,463, which is a continuation of application No. 13/313,244, filed on Dec. 7, 2011, now Pat. No. 9,568,794.

(51) Int. Cl.

| | | |
|---|---|---|
| *G02F 1/1368* | (2006.01) | |
| *H01L 27/12* | (2006.01) | |
| *G02F 1/1343* | (2006.01) | |
| *G09G 3/36* | (2006.01) | |
| *G02F 1/136* | (2006.01) | |
| *H01L 29/786* | (2006.01) | |

(52) U.S. Cl.
CPC .. *G02F 1/136213* (2013.01); *G02F 1/136277* (2013.01); *G09G 3/3677* (2013.01); *H01L 27/124* (2013.01); *H01L 27/1225* (2013.01); *H01L 27/1255* (2013.01); *G02F 2001/13606* (2013.01); *G02F 2001/136295* (2013.01); *G02F 2201/123* (2013.01); *G02F 2202/10* (2013.01); *G02F 2202/103* (2013.01); *G09G 2330/021* (2013.01); *H01L 29/7869* (2013.01); *H01L 29/78669* (2013.01)

(56) References Cited

U.S. PATENT DOCUMENTS

| | | | |
|---|---|---|---|
| 6,507,383 B1* | 1/2003 | Abe | G02F 1/133345 349/138 |
| 6,714,266 B1 | 3/2004 | Ueda et al. | |
| 6,750,087 B2 | 6/2004 | Morita et al. | |
| 6,900,853 B2* | 5/2005 | Watanabe | G02F 1/136227 257/59 |
| 7,173,676 B2 | 2/2007 | Jeon et al. | |
| 7,417,694 B2 | 8/2008 | Kim et al. | |
| 7,615,782 B2 | 11/2009 | Hoshino | |
| 7,777,825 B2 | 8/2010 | Noda et al. | |
| 7,786,482 B2 | 8/2010 | Yamazaki et al. | |
| 7,812,348 B2* | 10/2010 | Dairiki | H01L 29/04 257/59 |
| 7,825,412 B2 | 11/2010 | Watanabe et al. | |
| 7,872,699 B2 | 1/2011 | Kim et al. | |
| 7,903,190 B2 | 3/2011 | Noda et al. | |
| 8,031,283 B2 | 10/2011 | Araki et al. | |
| 8,035,768 B2 | 10/2011 | Noda et al. | |
| 8,059,077 B2 | 11/2011 | Uehara | |
| 8,309,959 B2 | 11/2012 | Matsumoto et al. | |
| 8,319,906 B2 | 11/2012 | Enda et al. | |
| 8,344,380 B2 | 1/2013 | Godo et al. | |
| 8,363,175 B2 | 1/2013 | Itsumi et al. | |
| 8,368,833 B2 | 2/2013 | Noda et al. | |
| 8,742,423 B2 | 6/2014 | Matsubara et al. | |
| 2001/0019372 A1* | 9/2001 | Ootsu | G02F 1/136213 349/38 |
| 2004/0001167 A1* | 1/2004 | Takeuchi | G02F 1/136213 349/38 |
| 2005/0122441 A1 | 6/2005 | Shimoshikiryoh | |
| 2006/0243979 A1* | 11/2006 | Park | G02F 1/136209 257/59 |
| 2006/0255403 A1* | 11/2006 | Asano | H01L 27/0605 257/335 |
| 2006/0263576 A1* | 11/2006 | Hirose | H01L 29/41733 428/149 |
| 2007/0085778 A1* | 4/2007 | Yoshida | G09G 3/22 345/75.2 |
| 2007/0132902 A1 | 6/2007 | Yao | |
| 2007/0170431 A1* | 7/2007 | Choi | G02F 1/136227 257/66 |
| 2008/0136985 A1* | 6/2008 | Hsieh | G02F 1/136213 349/39 |
| 2008/0252802 A1* | 10/2008 | Wang | G02F 1/136286 349/37 |
| 2008/0284931 A1* | 11/2008 | Kimura | G02F 1/13624 349/39 |
| 2008/0297676 A1 | 12/2008 | Kimura | |
| 2009/0002586 A1 | 1/2009 | Kimura | |
| 2009/0102826 A1* | 4/2009 | Oke | G02F 1/134363 345/211 |
| 2009/0159885 A1* | 6/2009 | Yamazaki | H01L 27/124 257/57 |
| 2009/0262274 A1* | 10/2009 | Noda | G02F 1/134309 349/54 |
| 2009/0295696 A1* | 12/2009 | Uehara | H01L 27/124 345/92 |
| 2009/0295701 A1* | 12/2009 | Matsumoto | H01L 29/41733 345/92 |
| 2010/0141849 A1* | 6/2010 | Enda | G02F 1/13624 348/731 |
| 2010/0148178 A1* | 6/2010 | Godo | H01L 27/12 257/59 |
| 2011/0147754 A1* | 6/2011 | Isa | H01L 27/12 257/60 |
| 2013/0120703 A1 | 5/2013 | Noda et al. | |
| 2014/0335653 A1* | 11/2014 | Koyama | G02F 1/136213 438/104 |

FOREIGN PATENT DOCUMENTS

| | | |
|---|---|---|
| EP | 2159632 A | 3/2010 |
| JP | 61-243487 A | 10/1986 |
| JP | 01-166020 A | 6/1989 |
| JP | 05-341322 A | 12/1993 |
| JP | 2001-042361 A | 2/2001 |
| JP | 2003-297850 A | 10/2003 |
| JP | 2005-222067 A | 8/2005 |
| JP | 2006-317867 A | 11/2006 |
| JP | 2007-164172 A | 6/2007 |
| JP | 2008-089646 A | 4/2008 |
| JP | 2008-159643 A | 7/2008 |
| JP | 2009-180981 A | 8/2009 |
| JP | 2009-265348 A | 11/2009 |
| JP | 2009-288462 A | 12/2009 |
| JP | 2010-003723 A | 1/2010 |
| JP | 2010-161358 A | 7/2010 |
| KR | 2009-0093876 A | 9/2009 |
| TW | 200723538 | 6/2007 |
| TW | 201030985 | 8/2010 |
| WO | WO-2006/064789 | 6/2006 |
| WO | WO-2008/096483 | 8/2008 |
| WO | WO-2009/001578 | 12/2008 |
| WO | WO-2010/107027 | 9/2010 |

OTHER PUBLICATIONS

Taiwanese Office Action (Application No. 100145330) dated Dec. 28, 2015.
Korean Office Action (Application No. 2011-0131673) dated Jun. 15, 2018.

* cited by examiner

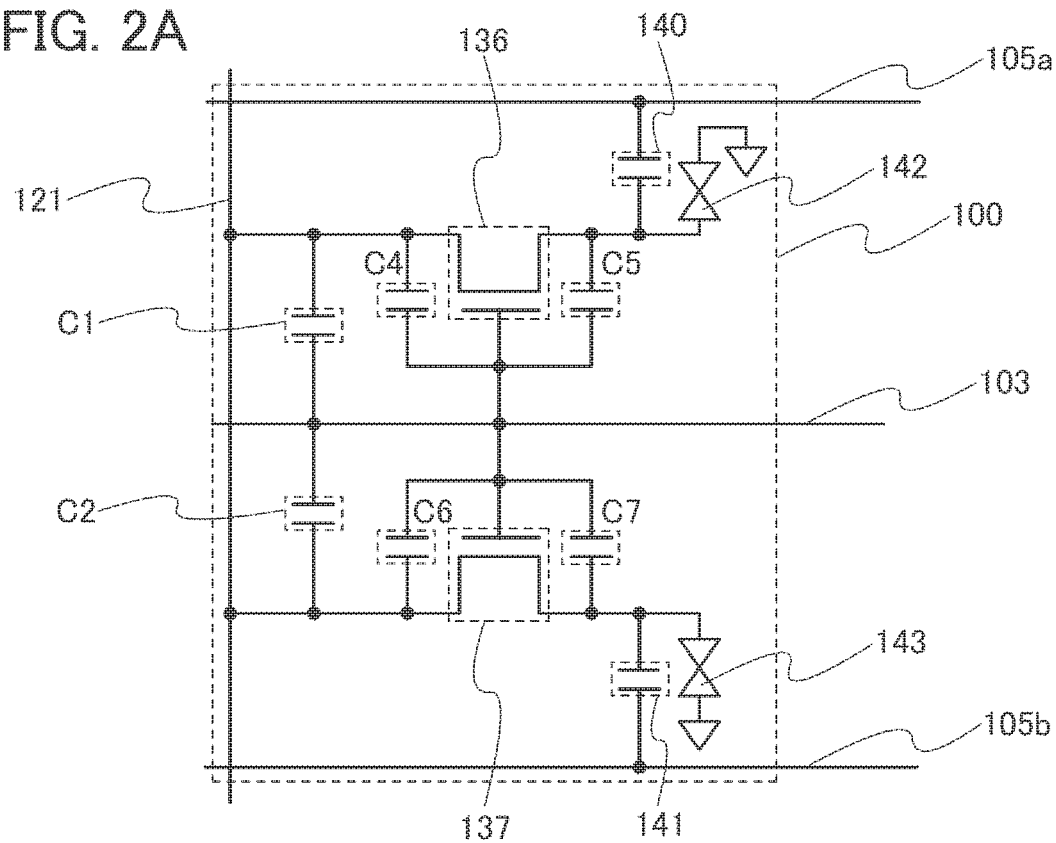
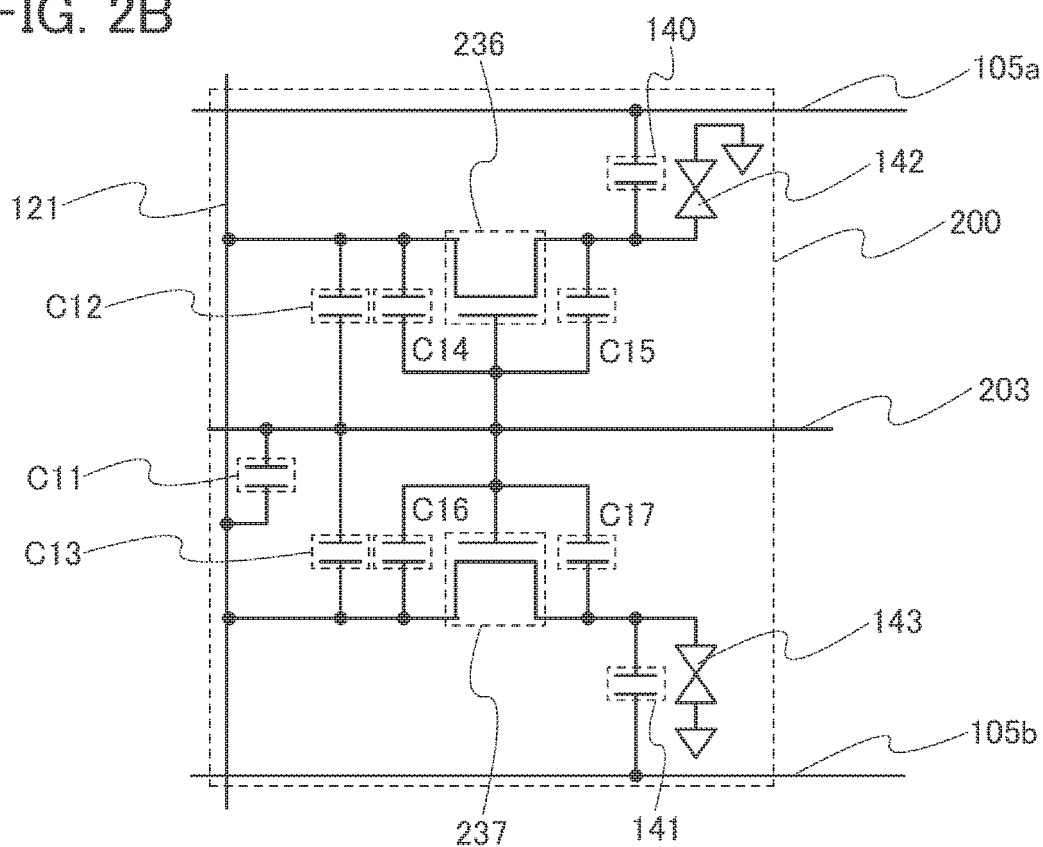

DISPLAY DEVICE

CROSS-REFERENCE TO RELATED APPLICATIONS

This application is a Continuation of U.S. patent application Ser. No. 15/585,926 filed May 3, 2017, which is a Continuation of U.S. patent application Ser. No. 15/368,969 filed Dec. 5, 2016, which is a Continuation of U.S. patent application Ser. No. 13/313,244 filed Dec. 7, 2011, which claims the benefit of Japanese Patent Application No. 2010-282635, filed Dec. 20, 2010.

BACKGROUND OF THE INVENTION

1. Field of the Invention

The present invention relates to a display device and a method for manufacturing the display device.

2. Description of the Related Art

In recent years, as liquid crystal display devices in which viewing angle characteristics and display quality are improved, vertically aligned (VA) liquid crystal display devices are provided. As VA liquid crystal display devices, a multi-domain liquid crystal display device including one pixel provided with a plurality of pixel electrodes and thin film transistors which are connected to the respective pixel electrodes and control the potentials of the respective pixel electrodes is provided. When one pixel is provided with a plurality of pixel electrodes, liquid crystal alignment can be made different in each pixel electrode; therefore, a multi-domain liquid crystal display device can have a larger viewing angle than those of conventional VA liquid crystal display devices (see Patent Document 1).

Moreover, there is a trend in a liquid crystal display device toward a larger screen, e.g., a 60-inch diagonal screen, and further, the development of a liquid crystal display device is aimed even at a screen size of a diagonal of 120 inches or more. In addition, a trend in resolution of a screen is toward higher definition, e.g., high-definition (HD) image quality (1366×768) or full high-definition (FHD) image quality (1920×1080), and prompt development of a so-called 4K Digital Cinema liquid crystal display device, which has a resolution of 3840×2048 or 4096×2180, is also pushed.

In order to reduce afterimages and improve the display quality, the driving rate has been doubted (also referred to as a double-frame rate driving), and further, driving at a quadruple-frame rate or a higher rate than the quadruple-frame rate has been considered. Further, in order to realize a liquid crystal display device with three-dimensional (3D) display, an image for a right eye and an image for a left eye need to be displayed alternately; thus, the liquid crystal display device is required to be driven at the double-frame rate or a higher rate than the double-frame rate.

REFERENCE

[Patent Document 1] Japanese Published Patent Application No. 2006-317867

SUMMARY OF THE INVENTION

However, as a liquid crystal display device has a larger size and a higher definition, the number of pixels needed for the liquid crystal display device are significantly increased and writing time for one pixel is shortened. Therefore, a thin film transistor which controls the potential of a pixel electrode is required to have high speed operation, high on-current, and the like.

Further, increase in wiring resistance and parasitic capacitance between wirings causes delay of signal transmission to an end portion of a signal line. As a result, deterioration of display quality, such as display unevenness or a defect in grayscale, or increase in power consumption is caused.

An object of one embodiment of the present invention is to provide a display device in which parasitic capacitance between wirings can be reduced while preventing increase in wiring resistance. An object of one embodiment of the present invention is to provide a display device with improved display quality. An object of one embodiment of the present invention is to provide a display device with low power consumption.

In a liquid crystal display device of one embodiment of the present invention, a pixel includes a signal line, a scan line intersecting with the signal line, a first electrode projected from the signal line, a second electrode facing the first electrode, and a pixel electrode connected to the second electrode. Part of the scan line has a loop shape including an opening, and part of the first electrode is located in a region overlapped with the opening of the scan line. In other words, part of the first electrode is not overlapped with the scan line.

In a multi-domain liquid crystal display device of one embodiment of the present invention, a pixel includes a signal line, a scan line intersecting with the signal line, a first electrode projected from the signal line, a plurality of second electrodes facing the first electrode, and a plurality of pixel electrodes connected to the plurality of second electrodes. Part of the scan line has a loop shape including an opening. A first thin film transistor includes the scan line, the first electrode, the gate insulating film, the semiconductor film, and one of the plurality of second electrodes, and the opening of the scan line and the first electrode are overlapped with each other. In addition, a second thin film transistor includes the scan line, the first electrode, the gate insulating film, the semiconductor film, and another one of the plurality of second electrodes, and the opening of the scan line and the first electrode are overlapped with each other.

In the above scan line, part of the scan line is a region having a loop shape including an opening and the other part of the scan line is a region extending in a direction intersecting with the signal line. In the part of the scan line, it is preferable that the total width of the scan lines interposing the opening be larger than the width of the other portion of the scan line. Alternatively, it is preferable that an end portion of the part of the scan line be located on an outer side than an end portion of the other part of the scan line. Moreover, the scan line has the loop shape in a region where the end portion of the part of the scan line is located on the outer side than the end portion of the other part of the scan line.

Note that the first electrode serves as one of the source electrode and the drain electrode of each of the first and second thin film transistors. The one of the plurality of second electrodes serves as the other of the source electrode and the drain electrode of the first thin film transistor, and the another one of the plurality of second electrodes serves as the other of the source electrode and the drain electrode of the second thin film transistor.

The first electrode may be provided between the plurality of second electrodes when seen from the above. Alternatively, the second electrode and a third electrode may be provided on one side of the first electrode when seen from the above.

A plurality of thin film transistors have the first electrode which serves as the one of the source electrode and the drain electrode, in common. Therefore, the area where the one of the source electrode and the drain electrode and the scan line are overlapped with each other can be reduced, and parasitic capacitance generated between the scan line and the first electrode can be reduced while keeping the aperture ratio of a pixel.

In addition, part of the scan line has a loop shape including an opening, and the first electrode which serves as the one of the source electrode and the drain electrode in the thin film transistor is located in a region overlapped with the opening. Thus, the area where the scan line having a loop shape and the first electrode are overlapped with each other can be reduced and parasitic capacitance between the scan line and the first electrode can be reduced.

By applying one embodiment of the present invention, parasitic capacitance between wirings can be reduced while preventing increase in wiring resistance and keeping the aperture ratio of a pixel. By, applying one embodiment of the present invention, display quality of a display device can be improved. By applying one embodiment of the present invention, power consumption of a display device can be reduced.

BRIEF DESCRIPTION OF THE DRAWINGS

FIGS. 2A and 2B are circuit diagrams each illustrating a configuration of a multi-domain pixel.

DETAILED DESCRIPTION OF THE INVENTION

Figure 1:
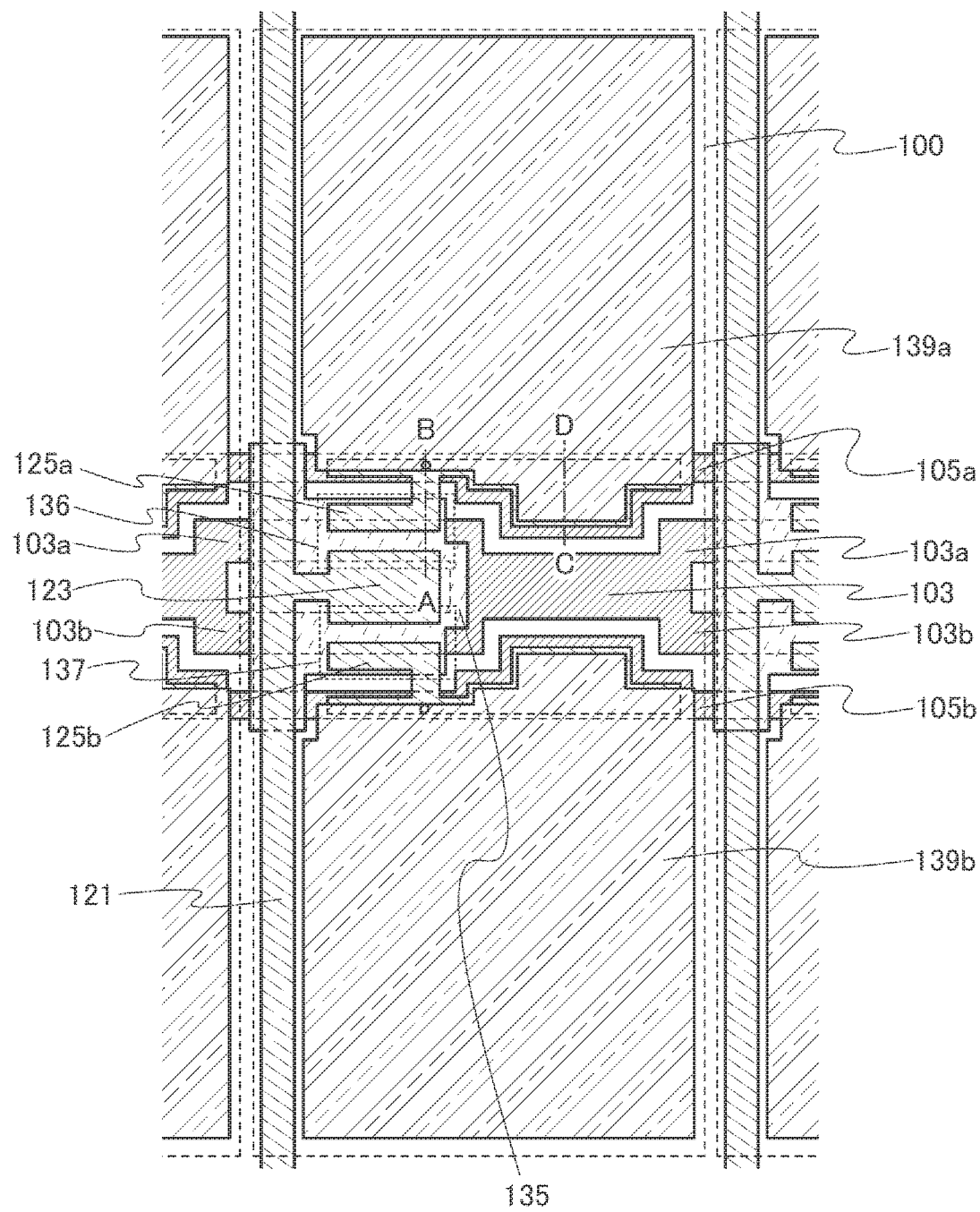
FIG. 1 is a top view illustrating a structure of a pixel of a display device according to one embodiment of the present invention.

Hereinafter, embodiments of the present invention are described with reference to the drawings. However, the present invention is not limited to the following description. It is easily understood by those skilled in the art that the mode and detail can be variously changed unless departing from the scope and spirit of the present invention. Therefore, the present invention is not construed as being limited to the following description of the embodiments. Note that reference numerals denoting the same portions are commonly used in different drawings.

Note that in this specification, the terms "first", "second", "third", and "n-th" (n is a natural number) are used in order to avoid confusion among components and do not limit the number of components.

(Embodiment 1)

In this embodiment, a structure of a pixel of a liquid crystal display device in which wiring capacitance is reduced will be described with reference to FIG. 1. FIGS. 2A and 2B, FIGS. 3A and 3B, and FIGS. 8A to 8C. Note that a pixel in which one pixel is provided wish a plurality of subpixels is described as a pixel 100 in this embodiment; however, one embodiment of the present invention is not limited thereto.

Figure 3A:
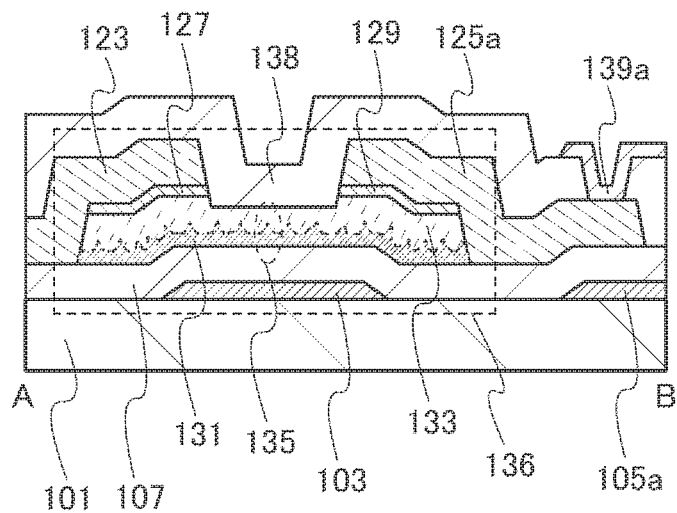
FIGS. 3A and 3B are cross-sectional views illustrating a thin film transistor and a capacitor of a display device according to one embodiment of the present invention.
Figure 3B:
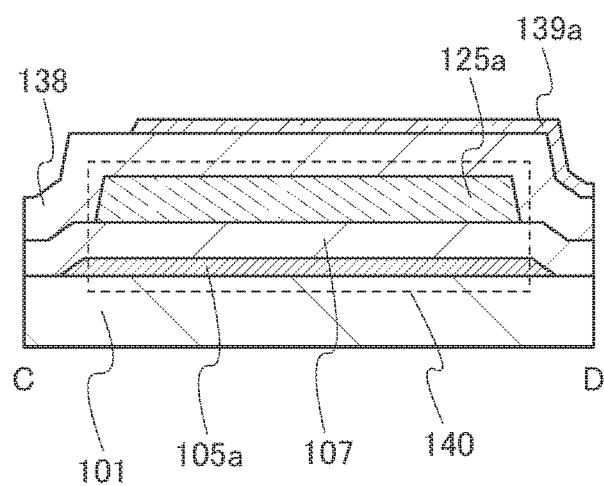
Figure 8A:
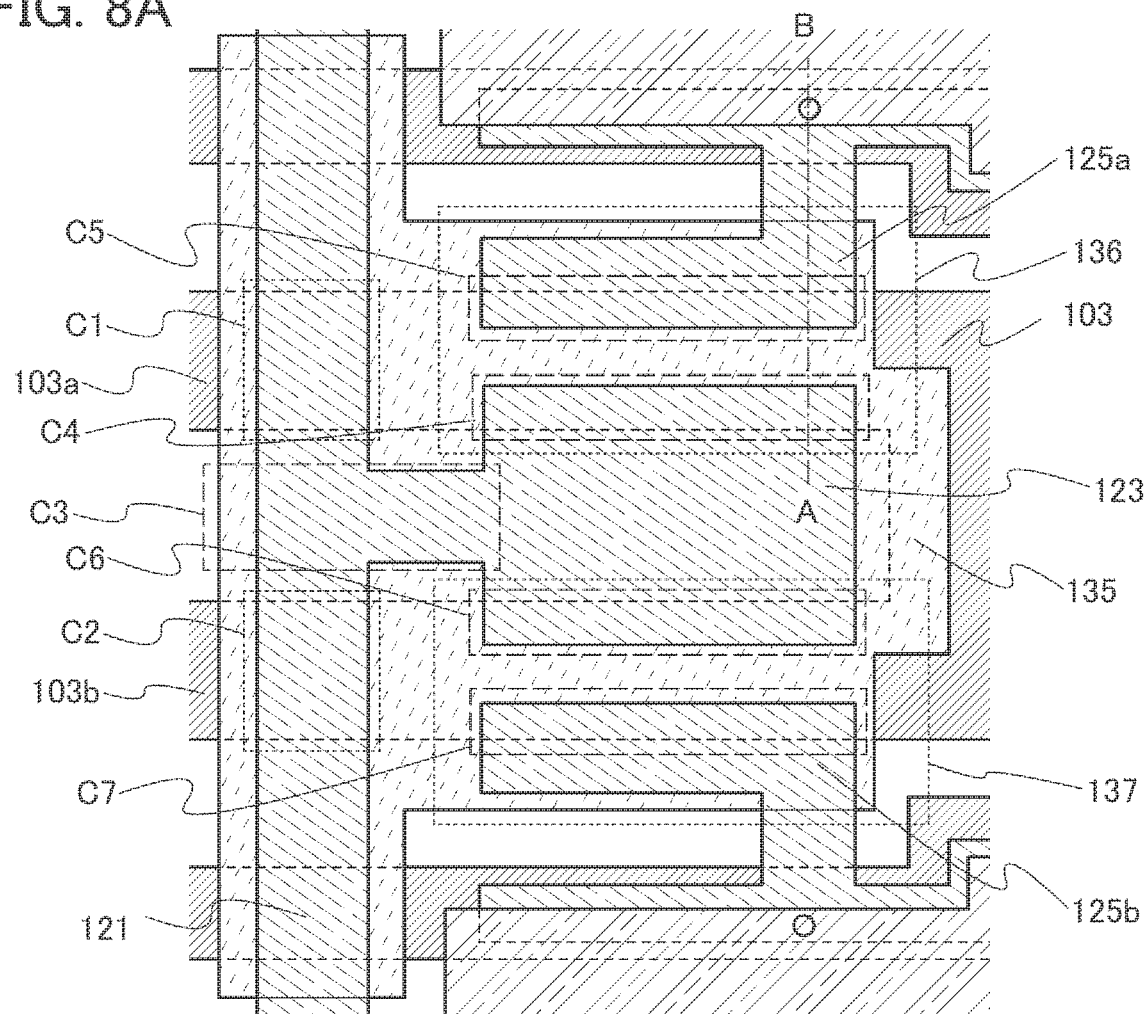
FIGS. 8A to 8C are top views each illustrating a structure of a pixel of a display device according to one embodiment of the present invention.
Figure 8B:
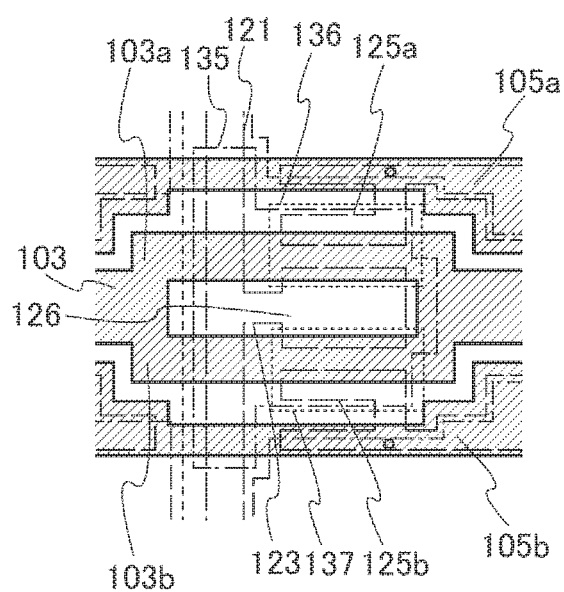
Figure 8C:
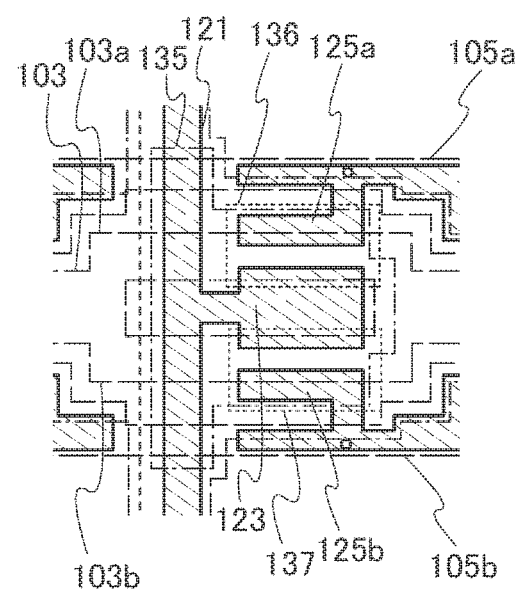

FIG. 1 is a top view of the pixel 100 of a multi-domain liquid crystal display device, which is described in this embodiment. FIG. 2A is a circuit diagram of the pixel 100 in FIG. 1. FIG. 2B is a circuit diagram of a conventional pixel. FIG. 3A is a cross-sectional view taken along dashed-and-dotted line A-B in FIG. 1. FIG. 3B is a cross-sectional view taken along dashed-and-dotted line C-D in FIG. 1. FIG. 8A is an enlarged top view of the vicinity of a thin film transistor 136 and a thin film transistor 137 in FIG. 1. FIG. 8B is a top view illustrating only a scan line 103, a scan line 103a, a scan line 103b, a capacitor wiring 105a, and a capacitor wiring 105b using hatching in order to make the shapes of the scan line 103, the Sean line 103a, and the scan line 103b in FIG. 8A clear. FIG. 8C is a top view illustrating only a signal line 121, a first electrode 123, a second electrode 125a, and a third electrode 125b using hatching in order to make the shape of the first electrode 123 in FIG. 8A clear. Note that FIGS. 8B and 8C are each a reduced view of part of FIG. 1.

As illustrated in FIG. 1 and FIG. 2A, the pixel 100 includes the scan line 103; the signal line 121 which intersects with the scan line 103; and the capacitor wiring 105a and the capacitor wiring 105b which extend in the same direction as the scan line 103. The scan line 103 is provided between the capacitor wiring 105a and the capacitor wiring 105b.

The pixel 100 includes the thin film transistor 136 and the thin film transistor 137 in the vicinity of the intersection portion of the scan line 103 and the signal line 121. The thin film transistor 136 includes a semiconductor film 135 overlapped with the scan line 103, and the first electrode 123 and the second electrode 125a which are overlapped with the semiconductor film 135. The first electrode 123 is a region projected from the signal line 121. The first electrode 123 and the second electrode 125a serve as a source electrode and a drain electrode in the thin film transistor 136.

The thin film transistor 137 includes the semiconductor film 135 overlapped with the scan line 103, and the first electrode 123 and the third electrode 125b which are overlapped with the semiconductor film 135. The first electrode 123 and the third electrode 125b serve as a source electrode and a drain electrode in the thin film transistor 137.

The second electrode 125a included in the thin film transistor 136 is connected to a pixel electrode 139a. In other words, the thin film transistor 136 is connected to a liquid crystal element 142 including the pixel electrode 139a through the second electrode 125a. Further, one electrode of a capacitor 140 is connected to the pixel electrode 139a and the second electrode 125a of the thin film transistor 136, and the other electrode of the capacitor 140 is connected to the capacitor wiring 105a (see FIG. 2A).

The third electrode 125b included in the thin film transistor 137 is connected to a pixel electrode 139b. In other words, the thin film transistor 137 is connected to a liquid crystal element 143 including the pixel electrode 139b through the third electrode 125b. One electrode of a capacitor 141 is connected to the pixel electrode 139b and the third electrode 125b of the thin film transistor 137, and the other electrode of the capacitor 141 is connected to the capacitor wiring 105b (see FIG. 2A). In other words, the thin film transistor 136 and the thin film transistor 137 are located almost at the center of the pixel 100 when seen form the above and formed between the pixel electrode 139a and the pixel electrode 139b which are subpixels of the pixel 100. When the thin film transistors 136 and 137 are provided between the pixel electrode 139a and the pixel electrode 139b, the connection distance between the second electrode 125a and the pixel electrode 139a and the connection distance between the third electrode 125b and the pixel electrode 139b can be shortened, so that parasitic capacitance generated between the second electrode 125a and the pixel electrode 139a and between the third electrode 125b and the pixel electrode 139b can be reduced and decrease in aperture ratio of the pixel 100 can be prevented.

The thin film transistor 136 and the thin film transistor 137 include the first electrode 123 which is one of the source electrode and the drain electrode, in common. In other words, in each pixel, only the first electrode 123 is an electrode projected from the signal line and is common in the thin film transistors 136 and 137; therefore, parasitic capacitance generated between the scan line 103 and the first electrode 123 projected from the signal line 121 can be reduced.

In the vicinity of a region where the thin film transistor 136 and the thin film transistor 137 are formed, the scan line 103 has a loop shape in which the scan line 103 becomes the scan line 103a and the scan line 103b and includes an opening 126. In other words, a scan line is formed using the scan line 103 which is a region extending in a direction intersecting with the signal line 121, and the scan line 103a and the scan line 103b which form a loop shape with the opening 126 interposed therebetween. At this time, the total width of the scan line 103a and the scan line 103b interposing the opening 126 is larger than the width of the scan line 103. Alternatively, in the scan line 103a and the scan line 103b which form the loop shape, end portions of the scan line 103a and the scan line 103b are projected on outer sides than end portions of the scan line 103 (see FIG. 8B). Part of the first electrode 123 is provided in the opening provided between the scan line 103a and the scan line 103b which form the loop shape (see FIG. 8C). Since the total width of the scan line 103a and the scan line 103b is larger than the width of the scan line 103, increase in wiring resistance can be prevented and defects of the semiconductor device due to heat, electrostatic discharge, or the like can be reduced in the scan line 103a and the scan line 103b which diverge from the scan line 103.

Note that as illustrated in FIG. 2A and FIG. 8A, in the thin film transistor 136, parasitic capacitance C4 is generated in a portion where the scan line 103a and the first electrode 123 are overlapped with each other. Further, parasitic capacitance C5 is generated in a portion where the scan line 103a and the second electrode 125a are overlapped with each other. In the thin film transistor 137, parasitic capacitance C6 is generated in a portion where the scan line 103b and the first electrode 123 are overlapped with each other. Further, parasitic capacitance C7 is generated in a portion where the scan line 103b and the third electrode 125b are overlapped with each other.

Here, as a reference example, FIG. 2B is a circuit diagram of a pixel 200 which includes a scan line 203 having a linear shape, not a loop shape, in regions overlapped with thin film transistors 236 and 237 and in which different electrodes are connected to the signal line 121 in the thin film transistors 236 and 237. The structure similar to that in FIG. 2A is denoted by the same reference numerals, and description thereof is omitted.

As illustrated in FIG. 2B, the pixel 200 includes the scan line 203; the signal line 121 which intersects with the scan line 203; and the capacitor wiring 105a and the capacitor wiring 105b which extend in the same direction as the scan line 203. The scan line 203 is provided between the capacitor wiring 105a and the capacitor wiring 105b.

The pixel 200 includes the thin film transistor 236 and the thin film transistor 237 in the vicinity of the intersection portion of the scan line 203 and the signal line 121. The thin film transistor 236 includes a gate electrode connected to the scan line 203, a first electrode projected from the signal line 121, and a second electrode connected to the liquid crystal element 142. One electrode of the capacitor 140 is connected to the pixel electrode included in the liquid crystal element 142 and the second electrode of the thin film transistor 236, and the other electrode of the capacitor 140 is connected to the capacitor wiring 105a.

The thin film transistor 237 includes a gate electrode connected to the scan line 203, a third electrode projected from the signal line 121, and a fourth electrode connected to the liquid crystal element 143. One electrode of she capacitor 141 is connected to the pixel electrode included in the liquid crystal element 143 and the fourth electrode of the thin film transistor 237, and the other electrode of the capacitor 141 is connected to the capacitor wiring 105b.

Note that in the thin film transistor 236, parasitic capacitance C14 is generated in a portion where the scan line 203 and the first electrode are overlapped with each other. Further, parasitic capacitance C15 as generated in a portion where she scan line 203 and the second electrode are overlapped with each other. In the thin film transistor 237, parasitic capacitance C16 is generated in a portion where the scan line 203 and the third electrode are overlapped with each other. Further, parasitic capacitance C17 is generated in a portion where the scan line 203 and the fourth electrode are overlapped with each other.

In the thin film transistor 136 and the thin film transistor 236, when the area of the portion where the scan line 103a and the first electrode are overlapped with each other and the area of the portion where the scan line 203 and the first electrode are overlapped with each other are substantially the same, parasitic capacitance C4 and parasitic capacitance C14 are substantially the same. In addition, when the area of the portion where the scan tine 103a and the second electrode are overlapped with each other and the area of the portion where the scan line 203 and the second electrode are overlapped with each other are substantially the same, parasitic capacitance C5 and parasitic capacitance C15 are substantially the same. In the thin film transistor 137 and the thin film transistor 237, when the area of the portion where the scars line 103b and the first electrode are overlapped with each other and the area of the portion where the scan line 203 and the third electrode are overlapped with each other are substantially the same, parasitic capacitance C6 and parasitic capacitance C16 are substantially the same. The area of the portion where the scan line 103b and the third electrode are overlapped with each other and the area of the portion where the scan line 203 and the fourth electrode are overlapped with each other are substantially the same, parasitic capacitance C7 and parasitic capacitance C17 are substantially the same.

In the pixel 200 including the scan line 203 having a linear shape, not a loop shape, in a region overlapped with the thin film transistors, which is a comparative example, parasitic capacitance C11 is generated between the scan line 203 and the signal line 121 as illustrated in FIG. 2B. Further, in the thin film transistor 236 and the thin film transistor 237, in the case where electrodes which serve as source electrodes or drain electrodes are different electrodes (the first electrode in the thin film transistor 236 and the third electrode In the thin film transistor 237), that is, in the case where the first electrode of the thin film transistor 236 and the third electrode of the thin film transistor 237 are each connected to the signal line 121, parasitic capacitance C12 is generated between the scan line 203 and the first electrode and parasitic capacitance C13 is generated between the scan line 203 and the third electrode.

However, in the vicinity of the region where the thin film transistor 136 and the thin film transistor 137 are formed, the scan line 103 in this embodiment has a loop shape in which the sears line 103 becomes the scan line 103a and the scan line 103b, and includes the opening 126 as illustrated in FIG. 1 and FIG. 8B. The first electrode 123 is provided in the opening 126 provided between the scan line 103a and the scan line 103b which have the loop shape (see FIG. 8C). Therefore, parasitic capacitance is not generated between the scan line and the first electrode 123 in this region. In other words, parasitic capacitance C3 in FIG. 8A is zero. Note that parasitic capacitance C1 and parasitic capacitance C2 are generated between the scan line 103a and the signal line 123 and between the scan line 103b and the signal line 121, respectively.

When the total width of the scan line 103a and the scan line 103b is substantially the same as the width of the scan line 203, parasitic capacitance C11 in the pixel 200 and the total of parasitic capacitance C1 and parasitic capacitance C2 in the pixel 100 can be substantially the same; therefore, parasitic capacitance of the pixel 200 is larger than parasitic capacitance of the pixel 100 by parasitic capacitance C12 and parasitic capacitance C13.

In the pixel 100 in FIG. 1 and FIG. 2A, the thin film transistor 136 and the thin film transistor 137 include the first electrode 123 which is one of the source electrode and the drain electrode, in common (see FIG. 8C). Thus, resistance is generated in the first electrode 123.

However, in the case where the electrodes which serve as the source electrodes or the drain electrodes are different in the thin film transistor 236 and the thin film transistor 237 as illustrated in FIG. 2B, that is, in the case where the first electrode of the thin film transistor 236 and the third electrode of the thin film transistor 237 are each connected to the signal line 121, resistance is generated in each of the first electrode of the thin film transistor 236 and the third electrode of the thin film transistor 237.

From the above, as illustrated in FIG. 1 and FIG. 2A, the first electrode 123 projected from the signal line 121 is used as one of the source electrode and the drain electrode of each of the thin film transistors 136 and 137, so that the area where the scan line 103 and the first electrode 123 are overlapped with each other can be reduced and parasitic capacitance generated between the scan line 103 and the first electrode 123 can be reduced without a wide wiring width, that is, with keeping an aperture ratio. Note that here, the total width of the scan line 103a and the scan line 103b and the width of the scan line 203 are set substantially the same; however, the total width of the scan line 103a and the scan line 103b may be larger than the width of the scan line 103. Thus, increase in resistance of the scan line in the pixel can be prevented.

In the pixel 100 in FIG. 1, in the vicinity of a region where the signal line 121, the first electrode 123, the second electrode 125a, and the third electrode 125b intersect with the scan line 103a, the scan line 103b, the capacitor wiring 105a, and the capacitor wiring 105b, end portions of the semiconductor film 135 are located on outer sides than the portion where the signal line 121, the first electrode 123, the second electrode 125a, and the third electrode 125b intersect with the scan line 103a, the scan line 103b, the capacitor wiring 105a, and the capacitor wiring 105b. In other words, not only a gate insulating film but also the semiconductor film 135 is formed between the scan line 103a and the signal line 121, between the scan line 103b and the signal line 121, between the capacitor wiring 105a and the signal line 121, between the capacitor wiring 105b and the signal line 121, between the scan line 103a and the first electrode 123, between the scan line 103a and the second electrode 125a, and between the scan line 103b and the third electrode 125b; thus, parasitic capacitance between the wirings can be reduced.

Note that in the thin film transistors in this embodiment, the second electrode 125a and the third electrode 125b are provided with the first electrode 123 provided therebetween. Therefore, a direction of current flow from the first electrode 123 to the second electrode 125a, and a direction of current flow from the first electrode 123 to the third electrode 125b are opposite to each other. The pixel is divided to two and they are provided with thin film transistors with channel directions in which channel directions (directions of current flow) are different, whereby variations in electrical characteristics of the thin film transistor in each pixel due to variations in crystallinity of the semiconductor film 135 can be reduced. In addition, the thin film transistors 136 and 137 include the semiconductor film, in common; therefore, they can share a region with which the first electrode 123 and the semiconductor film are in contact. Accordingly, the area of the pixel 100 occupied by the thin film transistors 136 and 137 can be reduced.

Note that the structure where a pixel is provided with two thin film transistors is described in this embodiment: however, one embodiment of the present invention is not limited thereto. A structure where a pixel may be provided with three or more thin film transistors and a plurality of pixel electrodes connected to the thin film transistors may be employed.

Next, structures of the thin film transistor and the capacitor will be described with reference to FIGS. 3A and 3B.

FIG. 3A illustrates a cross-sectional structure of the thin film transistor 136 taken along dashed-and-dotted line A-B in FIG. 1.

The thin film transistor 136 includes, over a substrate 101, the scan line 103, the semiconductor film 135, a gate insulating film 107 provided between the scan line 103 and the semiconductor film 135, an impurity semiconductor film 127 and an impurity semiconductor film 129 which are in contact with the semiconductor film 135 and serve as a source region and a drain region, the first electrode 123 in contact with the impurity semiconductor film 127, and the second electrode 125a in contact with the impurity semiconductor film 129. An insulating film 138 covering the gate insulating film 107, the semiconductor film 135, the impurity semiconductor film 127, the impurity semiconductor film 129, the first electrode 123, and the second electrode 125a is formed. The pixel electrode 139a which is connected to the second electrode 125a in the opening of the insulating film 138 is formed.

As the substrate 101, a glass substrate; a ceramic substrate; a plastic substrate which has high heat resistance enough to withstand a process temperature of this manufacturing process; or the like can be used. In the case where the substrate does not need a light-transmitting property, a metal substrate, such as a stainless steel substrate, provided with an insulating film on its surface may be used. As the glass substrate, for example, an alkali-free glass substrate of barium borosilicate glass, aluminoborosilicate glass, aluminosilicate glass, or the like may be used. Note that there is no limitation on the size of the substrate 101. For example, any of glass substrates of the 3rd to 10th generations which are often used in liquid crystal display devices can be used.

Part of the scan line 103 serves as a gate electrode of the thin film transistor 136. The scan line 103 tan be formed as a single layer or a stacked layer using a metal material such as molybdenum, titanium, chromium, tantalum, tungsten, aluminum, copper, neodymium, scandium, or nickel or an alloy material which contains any of these materials as a main component. A semiconductor typified by polycrystalline silicon doped with an impurity element such as phosphorus, an Ag—Pd—Cu alloy, art Al—Nd alloy, an Al—Ni alloy, or the like may be used.

For example, the following is preferable as a two-layer structure of the scan line 103; a two-layer structure in which a molybdenum film is stacked over an aluminum film, a two-layer structure in which a molybdenum film is stacked over a copper film, a two-layer structure in which a titanium nitride film or a tantalum nitride film is stacked over a copper film, a two-layer structure in which a titanium nitride film and a molybdenum film are stacked, a two-layer structure in which a film of a copper-magnesium alloy containing oxygen and a copper film are stacked, a two-layer structure in which a film of a copper-manganese alloy containing oxygen and a copper film are stacked, a two-layer structure in which a copper-manganese alloy film and a copper film are stacked, or the like. As a three-layer structure, it is preferable to stack a tungsten film or a tungsten nitride film, an alloy film of aluminum and silicon or an alloy film of aluminum and titanium, and a titanium nitride film or a titanium film. By stacking a metal film functioning as a barrier film over a film having low electric resistance, electric resistance can be low and diffusion of a metal element from the metal film into the semiconductor film can be prevented.

Note that the capacitor wiring 105a and the capacitor wiring 105b are formed at the same time as the scan line 103. Therefore, the capacitor wiring 105a and the capacitor wiring 105b have a material and a stacked-layer structure similar to those of the scan line 103.

The gate insulating film 107 can be formed as a single layer or a stacked layer using a silicon oxide film, a silicon oxynitride film, a silicon nitride film, a silicon nitride oxide film, an aluminum oxide film, an aluminum nitride film, an aluminum oxynitride film, and/or an aluminum nitride oxide film. Note that in the case where the semiconductor film 135 is a microcrystalline silicon film, a layer of the gate insulating film 107, which is in contact with the semiconductor film 135, is formed using an oxide film such as a silicon oxide film or an aluminum oxide film, whereby nitrogen concentration at the interface with the semiconductor film 135 can be reduced, which leads to increase in reliability of electrical characteristics of the thin film transistor.

The silicon oxynitride means silicon that contains more oxygen than nitrogen, and preferably contains, when measured using Rutherford backscattering spectrometry (RBS) and hydrogen forward scattering (HFS), oxygen, nitrogen, silicon, and hydrogen at concentrations ranging from 50 at. % to 70 at. %, 0.5 at. % to 15 at. %, 25 at. % to 35 at. %. and 0.1 at. % to 10 at. %, respectively. Further, the silicon nitride oxide means silicon that contains more nitrogen than oxygen, and preferably contains, when measured using RBS and HFS, oxygen, nitrogen, silicon, and hydrogen at concentrations ranging from 5 at. % to 30 at. %, 20 at. % to 55 at. %, 25 at. % to 35 at. %, and 10 at. % to 30 at. %, respectively. Note that percentages of contained nitrogen, oxygen, silicon, and hydrogen fall within the ranges given above, where the total number of atoms contained in the silicon oxynitride or the silicon nitride oxide is defined as 100 at. %.

The semiconductor film 135 is formed using silicon, silicon germanium, or an oxide semiconductor. As a typical example of the oxide semiconductor, a four-component metal oxide such as art In—Sn—Ga—Zn—O film: a three-component metal oxide such as an In—Ga—Zn—O film, an In—Sn—Zn—O film, an In—Al—Zn—O film, a Sn—Ga—Zn—O film, an Al—Ga—Zn—O film, or a Sn—Al—Zn—O film; or a two-component metal oxide such as an In—Zn—O film, a Sn—Zn—O film, an Al—Zn—O film, or an In—Ga—O film can be used.

Further, the semiconductor film 135 can be formed as a single layer or a stacked-layer using an amorphous semiconductor, a microcrystalline semiconductor, and/or a crystalline semiconductor using any of the above semiconductor materials.

Note that a microcrystalline semiconductor is a semiconductor having an intermediate structure between amorphous and crystalline structures (including single crystal and polycrystal). A microcrystalline semiconductor is a semiconductor having a third state that is stable in terms of free energy and a crystalline semiconductor having short-range order and lattice distortion, in which columnar or needle-like mixed phase grains having a size of 2 nm to 200 nm, preferably 10 nm to 80 nm, more preferably 20 nm to 50 nm have grown in a direction normal to the substrate surface. Therefore, there is a case in which a crystal grain boundary is formed at the interface between the columnar or needle-like mixed phase grains.

The Raman spectrum of microcrystalline silicon, which is a typical example of a microcrystalline semiconductor, is located in a lower wave number side than 520 cm$^{-1}$, which represents single crystal silicon. That is, the peak of the Raman spectrum of the microcrystalline silicon exists between 520 cm$^{-1}$ which represents single crystal silicon and 480 cm$^{-1}$ which represents amorphous silicon. The microcrystalline semiconductor includes hydrogen or halogen at least 1 at. % to terminate a dangling bond. Moreover, when the microcrystalline semiconductor contains a rate gas element such as helium, argon, neon, krypton, or xenon to further promote lattice distortion, stability is increased and a favorable microcrystalline semiconductor can be obtained. Such a microcrystalline semiconductor is disclosed in, for example, U.S. Pat. No. 4,409,134.

Here, for the semiconductor film 135, a stacked-layer structure including a microcrystalline semiconductor region 131 and an amorphous semiconductor region 133 is employed.

The microcrystalline semiconductor region 131 has a surface with a sharp projection and/or a sharp depression; the projection has a conical or pyramidal shape whose width decreases from the gate insulating film 107 side toward the amorphous semiconductor region 133 (a tip of the projection has an acute angle). Note that the microcrystalline semiconductor region 131 may have a surface with an inverted conical or pyramidal shape whose width increases from the gate insulating film 107 side toward the amorphous semiconductor region 133.

In the macrocrystalline semiconductor region 131, nitrogen concentration is high at least in the projection region. An NH group or an $NH_2$ group may be contained in a crystal grain boundary included in the microcrystalline semiconductor region 131. When the concentration of nitrogen contained in the projection region of the microcrystalline semiconductor region 131 which is measured by secondary son mass spectrometry is higher than or equal to $1 \times 10^{20}$ atoms/$cm^3$ and lower than or equal to $1 \times 10^{21}$ atoms/$cm^3$, preferably higher than or equal to $2 \times 10^{20}$ atoms/$cm^3$ and lower than or equal to $1 \times 10^{21}$ atoms/$cm^3$, it is possible to form a projection and/or a depression having a conical or pyramidal shape or an inverted conical or pyramidal shape.

The amorphous semiconductor region 133 is formed using an amorphous semiconductor containing nitrogen. Nitrogen of the amorphous semiconductor containing nitrogen may exist, for example, as art NH group or an $NH_2$ group. As the amorphous semiconductor, amorphous silicon is used.

The amorphous semiconductor containing nitrogen is a semiconductor having a less amount of the defect absorption spectrum and lower-energy at an Urbach edge, measured by a constant photocurrent method (CPM) or photoluminescence spectroscopy, as compared to a conventional amorphous semiconductor. That is, as compared to the conventional amorphous semiconductor, the amorphous semiconductor containing nitrogen is a well-ordered semiconductor which has fewer defects and whose tail of a level at a band edge in the valence band is steep. Since the amorphous semiconductor containing nitrogen has a steep tail of a level at a band edge in the valence band, the band gap gets wider and less tunneling current flows. Therefore, the amorphous semiconductor containing nitrogen is provided between the microcrystalline semiconductor region 131 and the impurity semiconductor films 127 and 129, whereby the off-state current of the thin film transistor can be reduced. In addition, by providing the amorphous semiconductor containing nitrogen, the on-state current and the field-effect mobility can be increased.

Further, a peak region of a spectrum of the amorphous semiconductor containing nitrogen, obtained by performing low-temperature photoluminescence spectroscopy is greater than or equal to 1.31 eV and less than or equal to 1.39 eV. Note that a peak region of a spectrum of a microcrystalline semiconductor, typically microcrystalline silicon, obtained by performing low-temperature photoluminescence spectroscopy is greater than or equal to 0.98 eV and less than or equal to 1.02 eV. Therefore, the amorphous semiconductor containing nitrogen is different from a microcrystalline semiconductor.

Further, a semiconductor crystal grain whose grain size is greater than or equal to 1 nm and less than or equal to 10 nm, preferably greater than or equal to 1 nm and less than or equal to 5 nm is included in the amorphous semiconductor region 133, so that the on-state current and the filed-effect mobility of the thin film transistor can be further increased.

The impurity semiconductor films 127 and 129 may be provided as necessary. For example, in the case where the semiconductor Him is formed using a silicon film or a silicon germanium film and an n-channel thin film transistor is used, amorphous silicon to which phosphorus is added, microcrystalline silicon to which phosphorus is added, or the like is used for forming the impurity semiconductor films 127 and 129. Alternatively, a structure in which amorphous silicon to which phosphorus is added and macrocrystalline silicon to which phosphorus is added are stacked can be employed. In the case of a p-channel thin film transistor, the impurity semiconductor films 127 and 129 are formed using microcrystalline silicon to which boron is added, amorphous silicon to which boron is added, or the like is used.

The first electrode 123 and the second electrode 125a can be formed as a single layer or a stacked layer using any of aluminum, copper, titanium, neodymium, scandium, molybdenum, chromium, tantalum, tungsten, and/or the like . An aluminum alloy to which an element to prevent a hillock is added (e.g., an Al—Nd alloy which can be used for the scan line 103) may also be used. Alternatively, crystalline silicon to which an impurity element serving as a donor is added may be used. The first electrode 123 and the second electrode 125a may have a stacked-layer structure in which a layer on the side which is in contact with she crystalline silicon to which an impurity element serving as a donor is added is formed using titanium, tantalum, molybdenum, tungsten, or a nitride of any of these elements and aluminum or an aluminum alloy is formed thereover. Alternatively, another stacked-layer structure may be employed in which an upper surface and a lower surface of a layer of aluminum or an aluminum alloy are sandwiched between titanium, tantalum, molybdenum, tungsten, or a nitride of any of these elements.

Note that the third electrode 125b is formed at the same time as the first electrode 123 and the second electrode 125a. Therefore, the third electrode 125b has a material and a stacked-layer structure similar to those of the first electrode 123 and the second electrode 125a. In addition, the first electrode 123 is a region where part of the signal line 121 is projected. Therefore, the signal line 121 has a material and a stacked-layer structure similar to those of the first electrode 123.

The insulating film 138 can be formed using a material similar to that of the gate insulating film 107 as appropriate. Note that in the case where the insulating film 138 has a stacked-layer structure, a layer that is in contact with the semiconductor film 135 is preferably formed using art oxide film that is a silicon oxide film, an aluminum oxide film, or the like. This is because a region of the semiconductor film 135, which is in contact with the insulating film 138, functions as a channel region in the case where a back gate electrode is provided over the insulating film 138, and the reliability of the thin film transistor can be increased by reducing the nitrogen concentration of the channel region.

The pixel electrode 139a can be formed using a light-transmitting conductive material such as indium oxide containing tungsten oxide, indium zinc oxide containing tungsten oxide, indium oxide containing titanium oxide, indium tin oxide containing titanium oxide, indium tin oxide, indium zinc oxide, or indium tin oxide to which silicon oxide is added, or graphen.

The pixel electrode 139b is formed at the same time as the pixel electrode 139a. Therefore, the pixel electrode 139b has a material and a stacked-layer structure similar to those of the pixel electrode 139a.

FIG. 3B illustrates a cross-sectional structure of the capacitor taken along dashed-and-dotted line C-D in FIG. 1.

The capacitor 140 includes, over the substrate 101, the capacitor wiring 105a, the second electrode 125a, and the gate insulating film 107 provided between the capacitor wiring 105a and the second electrode 125a. The insulating film 138 which covers the gate insulating film 107 and the second electrode 125a is formed. The pixel electrode 139a which is connected to the second electrode 125a is formed over the insulating film 138.

Although not illustrated, the thin film transistor 137 has a structure similar to that of the thin film transistor 136. The capacitor 141 connected to the thin film transistor 137 has a structure similar to that of the capacitor 140.

According to this embodiment, in a multi-domain liquid crystal display device, parasitic capacitance between a scan line and a signal line and between the scan line and one of a source electrode and a drain electrode of a thin film transistor can be reduced. Thus, display quality can be improved in a large-sized liquid crystal display device, a liquid crystal display device capable of high-speed operation, and a liquid crystal display device with high resolution. In addition, power consumption of the liquid crystal display device can be reduced.

Note that the structure described in this embodiment can be used in combination with any of the structures described in the other embodiments, as appropriate.

(Embodiment 2)

In this embodiment, a structure of a pixel, which has a structure different from that in Embodiment 1, of a liquid crystal display device whose wiring capacitance is reduced will be described with reference to FIG. 4 and FIG. 5. Note that a pixel in which one pixel is provided with a plurality of subpixels is described as a pixel 150 in this embodiment: however one embodiment of the present invention is not limited thereto.

Figure 4:
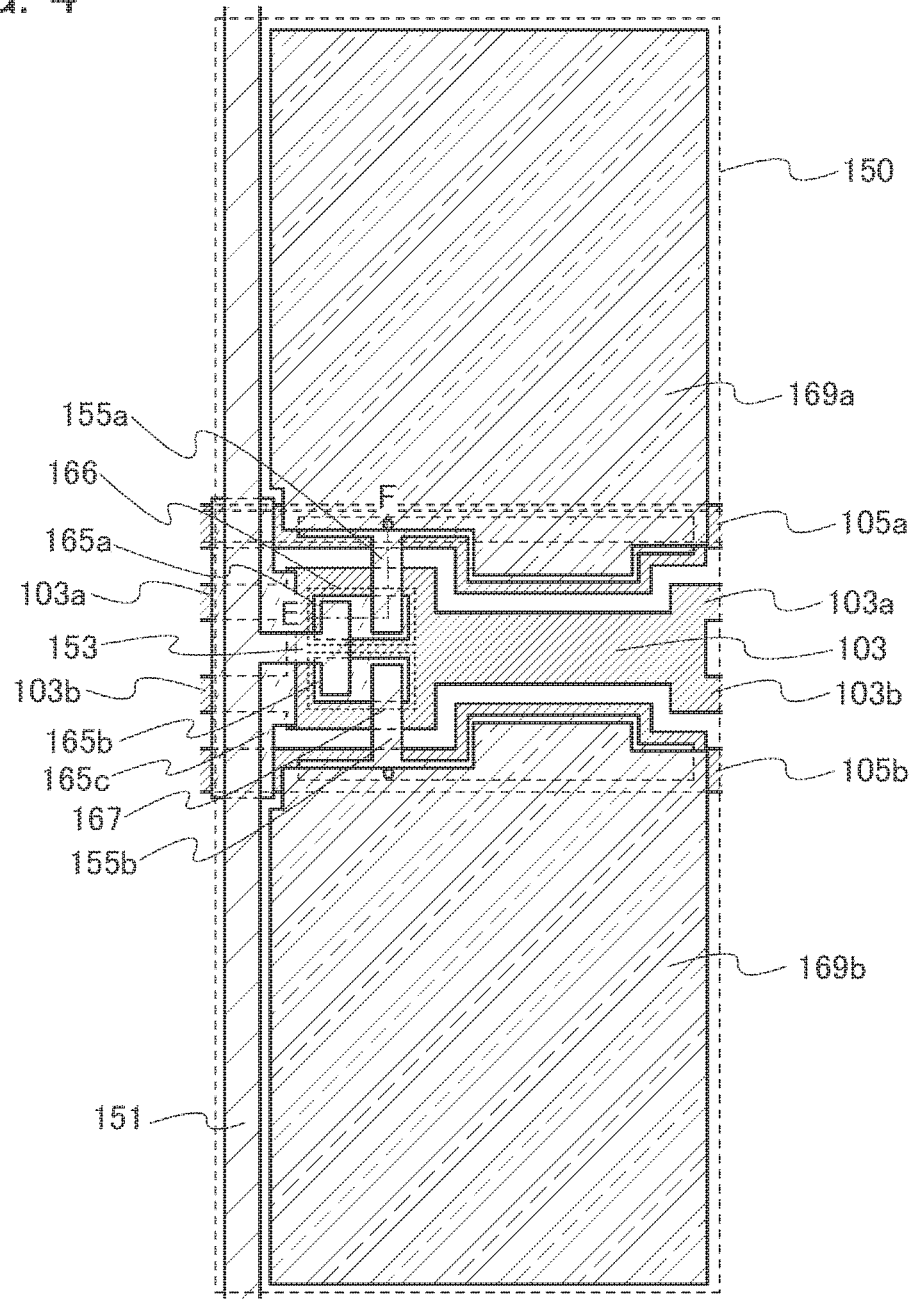
FIG. 4 is a top view illustrating a structure of a pixel of a display device according to one embodiment of the present invention.
Figure 5:
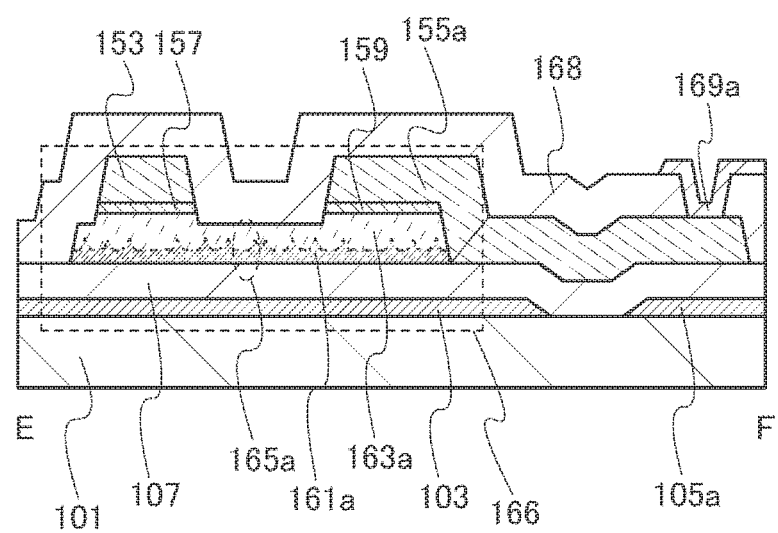
FIG. 5 is a cross-sectional view illustrating a thin film transistor of a display device according to one embodiment of the present invention.

FIG. 4 is a top view of the pixel 150 of a multi-domain liquid crystal display device, which is described in this embodiment, and FIG. 5 is a cross-sectional view taken along dashed-and-dotted line E-F in FIG. 4.

As illustrated in FIG. 4, the pixel 150 includes the scan line 103; a signal line 151 which intersects with the scan line 103; and the capacitor wiring 105a and the capacitor wiring 105b which extend in the same direction as the scan line 103. The scan line 103 is provided between the capacitor wiring 105a and the capacitor wiring 105b.

The pixel 150 includes a thin film transistor 166 and a thin film transistor 167 in the vicinity of the intersection portion of the scan line 103 and the signal line 151. The thin film transistor 166 includes a semiconductor film 165a overlapped with the scan line 103, and a first electrode 153 and a second electrode 155a which are overlapped with the semiconductor film 165a. The first electrode 153 is a region projected from the signal line 155. The first electrode 153 and the second electrode 155a serve as a source electrode and a drain electrode in the thin film transistor 166.

The thin film transistor 157 includes a semiconductor film 165b overlapped with the scan line 103, and the first electrode 153 and a third electrode 155b which are overlapped with the semiconductor film 165b. The first electrode 153 and the third electrode 155b serve as a source electrode and a drain electrode in the thin film transistor 167.

The second electrode 155a included in the thin film transistor 166 is connected to a pixel electrode 169a. Further, part of the second electrode 155a and part of the pixel electrode 169a are overlapped with the capacitor wiring 105a. A capacitor includes the capacitor wiring 105a, a gate insulating film, and the second electrode 155a.

The third electrode 155b included in the thin film transistor 167 is connected to a pixel electrode 169b. further, part of the third electrode 155b and part of the pixel electrode 169b are overlapped with, the capacitor wiring 105b. A capacitor includes the capacitor wiring 105b, the gate insulating film, and the third electrode 155b. In other words, the thin film transistors 166 and 167 are located almost at the center of the pixel 150 when seen form the above, like the thin film transistors 136 and 137, and formed between the pixel electrode 169a and the pixel electrode 169b in each subpixel of the pixel 150. Thus, parasitic capacitance generated between the second electrode 155a and the pixel electrode 169a and between the third electrode 155b and the pixel electrode 169b can be reduced and decrease in aperture ratio of the pixel 150 can be prevented.

The thin film transistor 166 and the thin film transistor 167 include the first electrode 153 which is one of the source electrode and the drain electrode, in common. In other words, in each pixel, only the first electrode 153 is an electrode projected from the signal line and is common in the thin film transistors 166 and 167; therefore, parasitic capacitance generated between the scan line 103 and the first electrode 153 projected from the signal line 151 can be reduced.

In the vicinity of the region where the thin film transistor 166 and the thin film transistor 167 are formed, the scan line 103 has a loop shape and becomes the scan line 103a and the scan line 103b. Part of the first electrode 153 is provided in an opening provided between the scan line 103a and the scan line 103b which have the loop shape. Therefore, when compared to the case where the thin film transistor 166 and the thin film transistor 167 are each provided with one of a source electrode and a drain electrode, the area where the scan line 103 and the first electrode 153 are overlapped with each other can be reduced, whereby parasite capacitance generated between the scan line 103 and the first electrode 153 can be reduced. Since the total width of the scan line 103a and the scan line 103b is larger than the width of the scan line 103, increase in wiring resistance can be prevented and defects of the semiconductor device due to heat, electrostatic discharge, or the like can be reduced in the scan line 103a and the scan line 103b which diverge from the scan line 103.

From the above, the area where the scan line 103 and the first electrode 153 are overlapped with each other can be reduced and parasitic capacitance generated between the scan line 103 and the first electrode 153 can be reduced without a wide wiring width, that is, with keeping an aperture ratio. In addition, resistance in the pixel can be reduced.

In the pixel 150 in FIG. 4, a semiconductor film 165c is provided between the scan line 103a and the signal line 151, between the scan line 103b and the signal line 151, between the capacitor wiring 105a and the signal line 151, and between the capacitor wiring 105b and the signal line 151. End portions of the semiconductor film 165c are located on outer sides than the intersection portion of the scan line 103a and the signal line 151, the intersection portion of the scan line 103b and the signal line 151, the intersection portion of the capacitor wiring 105a and the signal line 151, and the intersection portion of the capacitor wiring 105b and the signal line 151. Thus, not only the gate insulating film but also the semiconductor film 163c is formed between the above wirings; therefore, parasitic capacitance between the wirings can be reduced. Since the end portion of the semiconductor film 165c is overlapped with one end portion of the scan line 103, parasitic capacitance between the one end portion of the scan line 103 and part of the first electrode 153 is reduced.

In the thin film transistor 166 and the thin film transistor 167, an end portion of the semiconductor film 165a and an end portion of the semiconductor film 165b are located on an inner side than the scan line 103. Thus, irradiation with backlight or external light to the semiconductor film 165a and the semiconductor film 165b can be reduced, and light leakage current of the thin film transistor 166 and the thin film transistor 167 can be reduced.

Note that the thin film transistors in this embodiment are provided with the second electrode 155a and the third electrode 155b on one side of the first electrode 153 when seen from the above. In other words, the first electrode 153 projected front the signal line is provided between the signal line 151, and the second electrode 155a and the third electrode 155b. Thus, a direction of current flow between the first electrode 153 and the second electrode 155a and a direction of current flow between the first electrode 153 and the third electrode 155b are substantially the same. In the case where the semiconductor film is a microcrystalline semiconductor film or a crystalline semiconductor film, when an alignment direction of crystal and the above directions of current flow are made substantially the same, electrical characteristics of the thin film transistors can be improved. Since the thin film transistor 166 and the thin film transistor 167 have different semiconductor films, leak current between the thin film transistors is small; moreover, a variation in electrical characteristics between pixels can be reduced. This is because electrical characteristics of one of the thin film transistors do not affect electrical characteristics of the other of the thin film transistors even when the electrical characteristics of the one of the thin film transistors are poor.

Note that the structure where a pixel is provided with two thin film transistors is described in this embodiment; however, one embodiment of the present invention is not limited thereto. A structure where a pixel may be provided with three or more thin film transistors and a plurality of pixel electrodes connected to the thin film transistors may be employed.

Next, the structure of the thin film transistor will be described with reference to FIG. 5.

FIG. 5 illustrates a cross-sectional structure of the thin film transistor 166 taken along dashed-and-dotted line E-F in FIG. 4.

The thin film transistor 166 includes, over the substrate 101, the scan line 103, the semiconductor film 165a, the gate insulating film 107 provided between the scan line 103 and the semiconductor film 165a, an impurity semiconductor film 157 and an impurity semiconductor film 159 which are in contact with the semiconductor film 165a and serve as a source region and a drain region, the first electrode 153 in contact with the impurity semiconductor film 157, and the second electrode 155a in contact with the impurity semiconductor film 159. An insulating film 168 covering the gate insulating film 107, the semiconductor film 165a, the impurity semiconductor film 157, the impurity semiconductor film 159, the first electrode 153, and the second electrode 155a is formed. The pixel electrode 169a which is connected to the second electrode 155a in an opening of the insulating film 168 is formed.

For the semiconductor film 165a, a material and a structure similar to those of the semiconductor film 135 in Embodiment 1 can be used as appropriate.

Note that the semiconductor film 165b is formed at the same time as the semiconductor film 165a. Therefore, the semiconductor film 165b has a material and a stacked-layer structure similar to those of the semiconductor film 165a.

The impurity semiconductor films 157 and 159 may be formed as necessary. In the case where the impurity semiconductor films 157 and 159 are provided, materials and structures similar to those of the impurity semiconductor films 127 and 129 in Embodiment 1 can be used as appropriate.

For the first electrode 153 and the second electrode 155a, materials and structures similar to those of the first electrode 123 and the second electrode 125a in Embodiment 1 can be used as appropriate.

Note that the third electrode 155b is formed at the same time as the first electrode 153 and the second electrode 155a. Therefore, the third electrode 155b has a material and a stacked-layer structure similar to those of the first electrode 153 and the second electrode 155a. In addition, the first electrode 153 is a region where part of the signal line 151 is projected. Therefore, the signal line 151 has a material and a stacked-layer structure similar to those of the first electrode 153.

For the insulating film 168, a material and a structure similar to those of the insulating film 138 in Embodiment 1 can be used as appropriate.

For the pixel electrode 169a, a material and a structure similar to those of the pixel electrode 139a in Embodiment 1 can be used as appropriate.

The pixel electrode 169b is formed at the same time as the pixel electrode 169a. Therefore, the pixel electrode 169b has a material and a stacked-layer structure similar to those of the pixel electrode 169a.

According to this embodiment, in a multi-domain liquid crystal display device, parasitic capacitance between a scan line and a signal line and between the scan line and one of a source electrode and a drain electrode of a thin film transistor can be reduced. Thus, display quality can be improved in a large-steed liquid crystal display device, a liquid crystal display device capable of high-speed operation, and a liquid crystal display device with high resolution. In addition, power consumption of the liquid crystal display device can be reduced.

Note that the structure described in this embodiment can be used in combination with any of the structures described in the other embodiments, as appropriate.

(Embodiment 3)

In this embodiment, a method for manufacturing the thin film transistors described in Embodiments 1 and 2 will be described with reference to FIGS. 6A to 6D and FIGS. 7A and 7B. A method for manufacturing the thin film transistor 136 in Embodiment 1 is described here; however, the method can be applied to the thin film transistor 137 in Embodiment 1 and the thin film transistors 166 and 167 in Embodiment 2 as appropriate. Note that an n-channel thin film transistor has higher carrier mobility than a p-channel thin film transistor. Further, it is preferable that all thin film transistors formed over the same substrate have the same polarity because the number of manufacturing steps can be reduced. Therefore, in this embodiment, a method for manufacturing an n-channel thin film transistor is described.

Figure 6A:
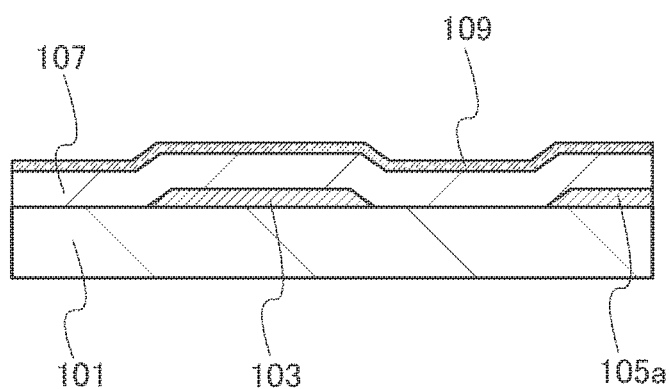
FIGS. 6A to 6D are cross-sectional views illustrating a method for manufacturing a thin film transistor of a display device according to one embodiment of the present invention.

As illustrated in FIG. 6A, the scan line 103 is formed over the substrate 101. Next, the gate insulating film 107 which covers the scan line 103 is formed, and a microcrystalline semiconductor film 109 is formed over the gate insulating film 107.

The scan line 103 can be formed in the following manner: a conductive film is formed over the substrate 101 by a sputtering method or a vacuum evaporation method using any of the above materials; a mask is formed over the conductive film by a photolithography method, an inkjet method, or the like; and the conductive film is etched using the mask. Alternatively, the scan line 103 can be formed by discharging a conductive nanopaste of silver, gold, copper, or the like over the substrate by an inkjet method and baking the conductive nanopaste. In order to improve adhesion between the scan line 103 and the substrate 101, a nitride film of any of the above metal materials may be provided between the substrate 101 and the scan line 103. In this embodiment, a conductive film is formed over the substrate 101 and etched using a mask which is formed of a resist formed by a photolithography method.

Note that side surfaces of the scan line 403 are preferably tapered. This is because an insulating film, a semiconductor film, and a wiring formed over the scan line 103 in later steps can be presented from being cut at a step portion of the scan line 103. In order to taper the side surfaces of the scan line 103, cubing may be performed while the mask which is formed of the resist is made to recede.

Through the step of forming the scan line 103, the capacitor wiring 105a and the capacitor wiring 105b can be formed at the same time.

The gate insulating film 107 can be formed by a CVD method, a sputtering method, or the like. When the gate insulating film 107 is formed, glow discharge plasma is generated by application of high-frequency power with a frequency of 3 MHz to 30 MHz, typically 13.56 MHz or 27.12 MHz in the HF band, or high-frequency power with a frequency of approximately 30 MHz to 300 MHz in the VHF band, typically 60 MHz. Alternatively, glow discharge plasma is generated by application of high-frequency power with a microwave frequency of 1 GHz or more. Note that a pulsed oscillation by which high-frequency power is applied in a pulsed manner or a continuous oscillation by which high-frequency power is applied continuously may be employed. In addition, by superimposing high-frequency power in the HF band and high-frequency power in the VHF band on each other, unevenness of plasma in a large-sized substrate is also reduced, so that uniformity can be improved and the deposition rate can be increased. When the gate insulating film 107 is formed using a microwave plasma CVD apparatus with a high frequency of 1 GHz or higher, the withstand voltage between the gate electrode and the drain and source electrodes can be improved, so that a highly reliable thin film transistor can be obtained.

Further, by forming a silicon oxide film by a CVD method using an organosilane gas as the gate insulating film 107, the crystallinity of the semiconductor film which is formed later can be improved, so that the on-state current and the field-effect mobility of the thin film transistor can be increased. Examples of the organosilane gas include silicon-containing compounds such as tetramethylsilane (TMS) (chemical formula: $Si(CH_3)_4$), tetramethylcyclotetrasiloxane (TMCTS), octamethylcyclotetrasiloxane (OMCTS), hexamethyldisilazane (HMDS), triethoxysilane (SiH($OC_2H_5)_3$), and tris(dimethylamino)silane ($SiH(N(CH_3)_2)_3$).

The microcrystalline semiconductor film 109 is formed in a reaction chamber of a plasma CVD apparatus by glow discharge plasma using a mixture of hydrogen and a deposition gas containing silicon or germanium. Alternatively, the microcrystalline semiconductor film 109 may be formed by glow discharge plasma using a mixture of hydrogen, a deposition gas containing silicon or germanium, and a rare gas such as helium, argon, neon, krypton, or xenon. Here, microcrystalline silicon, microcrystalline silicon-germanium, or the like is formed under a condition where the deposition gas containing silicon or germanium is diluted with hydrogen whose flow rate is greater than or equal to 50 times and less than or equal to 1000 times that of the deposition gas. The deposition temperature is preferably room temperature to 350° C., more preferably 150° C. to 280° C. The distance between an upper electrode and a lower electrode is set to a distance which allows generation of plasma.

Typical examples of the deposition gas containing silicon or germanium include $SiH_4$, $Si_2H_6$, $GeH_4$, and $Ge_2H_6$.

When a rare gas such as helium, argon, aeon, krypton, or xenon is added to a source gas of the microcrystalline semiconductor film 109, the deposition rate of the microcrystalline semiconductor film 109 can be increased. When the deposition rate is increased, the amount of impurities mixed into the microcrystalline semiconductor film 109 can be reduced. In addition, stable plasma can be generated without application of high power. Therefore, plasma damage to the microcrystalline semiconductor film 109 can be reduced and she crystallinity of the microcrystalline semiconductor film 109 can be improved.

For generation of glow discharge plasma in the formation step of the microcrystalline semiconductor film 109 by a CVD method, the generation condition of the glow discharge plasma when the gate insulating film 107 is formed can be employed as appropriate.

Figure 6B:
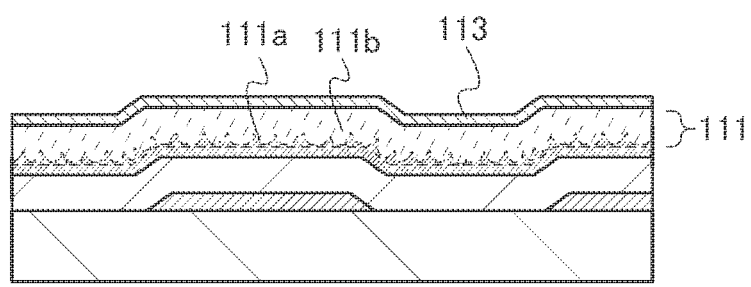
Figure 6C:
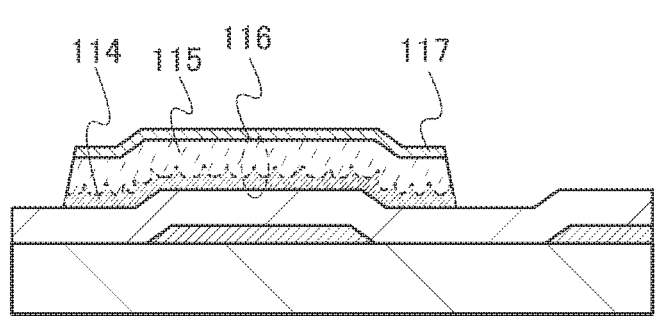

Then, as illustrated in FIG. 6B, a semiconductor film 111 is formed over the microcrystalline semiconductor film 109. The semiconductor film 111, includes a microcrystalline semiconductor region 111a and an amorphous semiconductor region 111b. Then, an impurity semiconductor film 113 is formed over the semiconductor film 111. Then, a mask is formed over the impurity semiconductor film 113.

The semiconductor film 111 including the microcrystalline semiconductor region 111a and the amorphous semiconductor region 111b can be formed under a condition which causes partial crystal growth using the microcrystalline semiconductor film 109 as a seed crystal (a condition under which the crystal growth is suppressed).

The semiconductor film 111 is formed in the process chamber of the plasma CVD apparatus by glow discharge plasma using a mixture of hydrogen, a gas containing nitrogen, and a deposition gas containing silicon or germanium. Examples of the gas containing nitrogen include ammonia, nitrogen, nitrogen fluoride, nitrogen chloride, chloroamine, fluoroamine, and the like. Glow discharge plasma can be generated as in the case of the gate insulating film 107.

In this case, the slow ratio of hydrogen and the deposition gas containing silicon or germanium is set so as to allow the formation of a microcrystalline semiconductor film as in she case of the microcrystalline semiconductor film 109, and a gas containing nitrogen is further used for the source gas, whereby crystal growth can be suppressed as compared to the deposition condition for the microcrystalline semiconductor film 109. Specifically, since a gas containing nitrogen is included in the source gas the crystal growth is partly suppressed at an early stage of the deposition of the semiconductor film 111; thus, a conical or pyramidal microcrystalline semiconductor region grows, and an amorphous semiconductor region is formed. Furthermore, at a middle stage or a later stage of the deposition, the crystal growth of the conical or pyramidal microcrystalline semiconductor region stops, and only the amorphous semiconductor region is deposited. As a result, in the semiconductor film 111, the microcrystalline semiconductor region 111a and the amorphous semiconductor region 111b which is formed using a well-ordered semiconductor film having fewer defects and a steep tail of a level at a band edge in the valence band, can be formed.

Here, a typical example of a condition for forming the semiconductor film 111 is a condition where the flow rate of hydrogen is 10 times to 2000 times, preferably 10 times to 200 times that of the deposition gas containing silicon or germanium. Note that in a typical example of a condition for forming a normal amorphous semiconductor film, the flow rate of hydrogen is 0 times to 5 times that of the deposition gas containing silicon or germanium.

By adding a rare gas such as helium, argon, neon, krypton, or xenon to the source gas of the semiconductor film 111, the deposition rate can be increased.

The thickness of the semiconductor film 111 is preferably 50 nm to 350 nm, more preferably 120 nm to 250 nm.

Here, the semiconductor film 111 including the microcrystalline semiconductor region 111a and the amorphous semiconductor region 111b is formed using the source gas including the gas containing nitrogen. Alternatively, the semiconductor film 111 including the microcrystalline semiconductor region 111a and the amorphous semiconductor region 111b can be formed in the following manner: the surface of the microcrystalline semiconductor film 109 is exposed to a gas containing nitrogen so that nitrogen is adsorbed to the surface of the microcrystalline semiconductor film 109, and then film deposition is performed using hydrogen and a deposition gas containing silicon or germanium as a source gas.

The impurity semiconductor film 113 is formed in a reaction chamber of the plasma CVD apparatus by glow discharge plasma using a mixture of hydrogen, phosphine (diluted with hydrogen or silane), and a deposition gas containing silicon, whereby amorphous silicon to which phosphorus is added or microcrystalline silicon to which phosphorus is added is formed. In the case of manufacturing a p-channel thin film transistor, as the impurity semiconductor film 113, amorphous silicon to which boron is added or microcrystalline silicon to which boron is added may be formed by glow discharge plasma using diborane instead of phosphine.

Further, in the case where the impurity semiconductor film 113 is formed using microcrystalline silicon to which phosphorus is added or microcrystalline silicon to which boron is added, a microcrystalline semiconductor film, typically a microcrystalline silicon film, is formed between the semiconductor film 111 and the impurity semiconductor film 113, so that characteristics of the interface can be improved. As a result, resistance generated at the interface between the impurity semiconductor film 113 and the semiconductor film 111 can be reduced. Therefore, the amount of current flow through the source region, the semiconductor film, and the drain region of the thin film transistor can be increased and the on-state current and the field-effect mobility can be increased.

The mask can be formed by a photolithography step.

Next, the microcrystalline semiconductor film 109, the semiconductor film 111, and the impurity semiconductor film 113 are etched using the mask. By this step, the microcrystalline semiconductor film 109, the semiconductor film 111, and the impurity semiconductor film 113 are divided for each element, whereby a semiconductor film 116 and an impurity semiconductor film 117 are formed. The semiconductor film 116 includes a microcrystalline semiconductor region 114 which includes part of the microcrystalline semiconductor film 109 and part of the microcrystalline semiconductor region 111a of the semiconductor film 111: and an amorphous semiconductor region 115 which includes part of the amorphous semiconductor region 111b of the semiconductor film 111. Then, the mask is removed (see FIG. 6C).

Figure 6D:
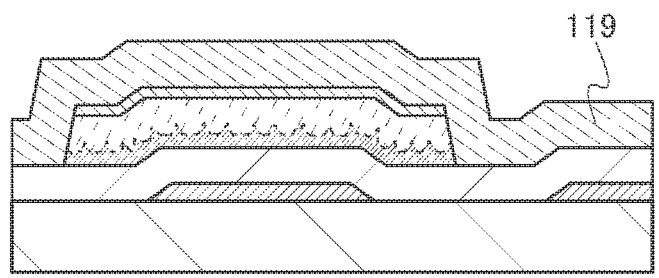

Next, a conductive film 119 is formed over the impurity semiconductor film 117 (see FIG. 6D). The conductive film 119 is formed by a CVD method, a sputtering method, or a vacuum evaporation method.

Next, a mask which is formed of a resist is formed through a photolithography step, and the conductive film 119 is etched using the mask which is formed of the resist to form the first electrode 123 and the second electrode 125a which serve as a source and drain electrodes. The etching of the conductive film 119 can be dry etching or wet etching. Alternatively, the first electrode 123 and the second electrode 125a may be formed by discharging a conductive nanopaste of silver, gold, copper, or the like by a screen printing method, an inkjet method, or the like and baking the conductive nanopaste. Note that the third electrode 125b and the signal line 121 are formed in this step.

Then, the impurity semiconductor film 117 and the semiconductor film 116 are partly etched, whereby the impurity semiconductor films 127 and 129 serving as a source and drain regions are formed. In addition, the semiconductor film 135 including the microcrystalline semiconductor region 114 and the amorphous semiconductor region 133 having a depression is formed.

Here, end portions of the first electrode 123 and the second electrode 125a are aligned with end portions of the impurity semiconductor film 127 and the impurity semiconductor film 129. However, the end portions of the first electrode 123 and the second electrode 125a and the end portions of the impurity semiconductor film 127 and the impurity semiconductor film 129 are not necessarily aligned with each other; the end portions of the first electrode 123 and the second electrode 125a may be located on an inner side than the end portions of the impurity semiconductor film 127 and the impurity semiconductor film 129 in a cross section.

Next, dry etching may be performed. The dry etching is performed under a condition where the amorphous semiconductor region 133 is not damaged and the etching rate with respect to the amorphous semiconductor region 133 is low. As an etching gas, $Cl_2$, $CF_4$, $N_2$, or the like is typically used. There is no particular limitation on an etching method, and an inductively coupled plasma (ICP) method, a capacitively coupled plasma (CCP) method, an electron cyclotron resonance (ECR) method, a reactive ion etching (RIE) method, or the like can be used.

Then, the surface of the amorphous semiconductor region 133 is subjected to plasma treatment typified by water plasma treatment, oxygen plasma treatment, ozone plasma treatment, $N_2O$ plasma treatment, plasma treatment using an oxidizing gas atmosphere, an example of which is plasma treatment using a mixed gas of oxygen and hydrogen, or the like. After that, the mask is removed. The mask may be removed before the dry etching of the impurity semiconductor film 117 and the semiconductor film 116.

As described above, dry etching is additionally performed under a condition where the amorphous semiconductor region 133 is not damaged, whereby an impurity such as a residue over the exposed amorphous semiconductor region 133 can be removed. Further, the dry etching may be followed by water plasma treatment or plasma treatment using a mixed gas of hydrogen and oxygen, whereby defects of the amorphous semiconductor region 133 can be reduced. Accordingly, the off-state current of the thin film transistor to be completed later can be reduced and a variation in electrical characteristics can be reduced.

Note that the mask which is formed of the resist is formed over the conductive film 119 in the photolithography step, and the conductive film 119 is etched using the mask, which is formed of the resist; whereby the first electrode 123 and the second electrode 125a which serve as a source and drain electrodes are formed. Next, the impurity semiconductor film 117 is etched to form the impurity semiconductor films 127 and 129 which serve as the source and drain regions. At this time, part of the semiconductor film 116 is etched in some cases. Next, after the mask is removed, part of the semiconductor film 116 may be etched to form the amorphous semiconductor region 133. In the case where a mixed gas of oxygen, HBr, and at least one of $CF_4$, $NF_3$, and $SF_6$ is used as an etching gas in the above etching step, a residue to be generated in the etching can be reduced, so that a variation in the characteristics of the thin film transistor can be reduced.

In addition, after the mash is removed, part of the amorphous semiconductor region 115 is etched using the first electrode 123 the second electrode 125a, whereby the amorphous semiconductor region 133 having a depression is formed. Thus, the amorphous semiconductor region which is in contact with the resist stripper and the residue of the resist is not left in a channel because they are removed by the etching. Consequently, leakage current due to the resist stripper and the residue of the resist left in a back channel is not generated, which can further reduce the off-state current of the thin film transistor.

Figure 7A:
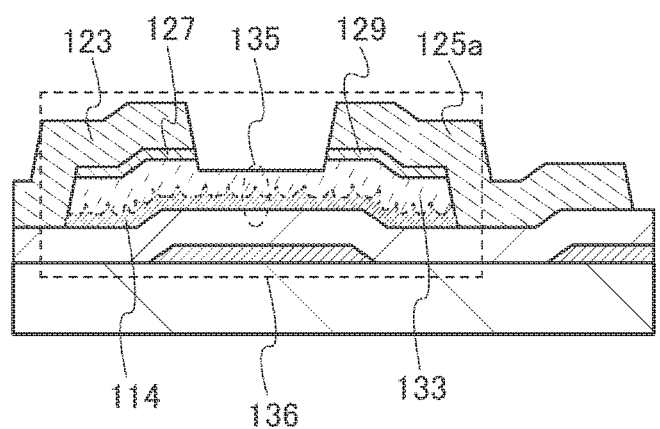
FIGS. 7A and 7B are cross-sectional views illustrating a method for manufacturing a thin film transistor of a display device according to one embodiment of the present invention.

Through the above-described process, a single-gate thin film transistor can be manufactured (see FIG. 7A). In addition, since the thin film transistor of this embodiment is an inverted staggered thin film transistor, a single-gate thin film transistor with high on-state current and high field-effect mobility, and low off-state current, in which change in electrical characteristics is suppressed can be manufactured with high productivity.

Figure 7B:
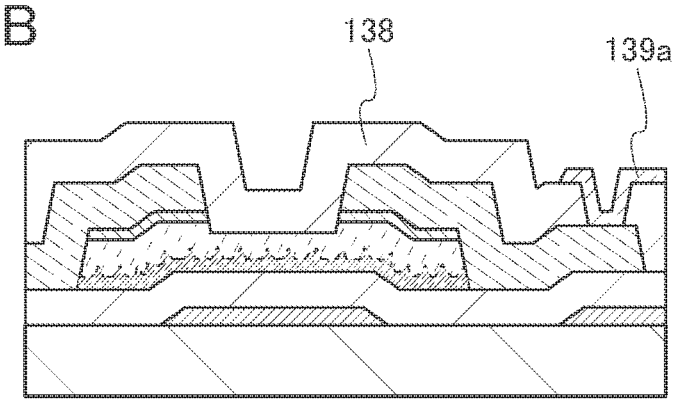

Next, as illustrated in FIG. 7B, the insulating film 138 is formed over the semiconductor film 135, the impurity semiconductor film 127, the impurity semiconductor film 129, the first electrode 123, and the second electrode 125a. The insulating film 138 can be formed in a manner similar to that of the gate insulating film 107.

Then, an-opening is formed in the insulating film 138 with the use of the mask which is formed of the resist in a photolithography step. The pixel electrode 139a is formed over the insulating film 138.

Through the above process, the thin film transistor and the pixel electrode connected to the thin dim transistor can be manufactured.

Note that the structure described in this embodiment can be used in combination with any of the structures described in the other embodiments, as appropriate.

This application is based on Japanese Patent Application serial no. 2010-28-2635 filed with japan Patent Office on Dec. 20, 2010, the entire contents of which are hereby incorporated by reference.

What is claimed is:

1. A display device comprising:
   a scan line having at least a first opening, a second opening adjacent to the first opening, a first section and a second section provided on respective sides adjacent to the first opening, and a third section located between the first opening and the second opening;
   a first capacitor wiring extending in parallel to the scan line;
   a signal line having a first part intersecting with the first section and the second section of the scan line and the first capacitor wiring and a second part projected from the first part of the signal line, the second part of the signal line overlapping with the first opening of the scan line;
   a first electrode and a second electrode facing each other with the second part of the signal line positioned therebetween;
   a first pixel electrode electrically connected to the first electrode;
   a second pixel electrode electrically connected to the second electrode; and
   a semiconductor film under and in contact with the second part of the signal line, the first electrode, and the second electrode,
   wherein the first capacitor wiring has a first region fully overlapped with the first part of the signal line, the first region comprising all area of first capacitor wiring overlapped with the signal line,
   wherein a full width of the first region of the first capacitor wiring is smaller than a full width of each of the first section and the second section of the scan line along an extending direction of the first part of the signal line, and
   wherein the semiconductor film overlaps with the first opening, the first section, the second section, and the third section of the scan line.

2. The display device according to claim 1, wherein the first opening of the scan line is positioned between the first section and the second section of the scan line.

3. The display device according to claim 1, wherein each of the scan line and the first capacitor wiring comprises a stacked layer using metal material selected from molybdenum, titanium, chromium, tantalum, tungsten, aluminum, copper, neodymium, scandium, and nickel.

4. The display device according to claim 1, wherein each of the signal line, the first electrode, and the second electrode comprises a stacked layer using metal material selected from molybdenum, titanium, chromium, tantalum, tungsten, aluminum, copper, neodymium, scandium, and nickel.

5. The display device according to claim 1, wherein the semiconductor film comprises amorphous silicon.

6. The display device according to claim 1, wherein the first electrode is electrically connected to the first capacitor wiring.

7. A display device comprising:
   a scan line extending along a first direction, the scan line having at least a first opening, a second opening adjacent to the first opening, a first section and a second section provided on respective sides adjacent to the first opening, and a third section located between the first opening and the second opening;
   a first capacitor wiring extending along the first direction;
   a signal line having a first part extending along a second direction intersecting with the first direction and a second part projected from the first part of the signal line, the second part of the signal line overlapping with the first opening of the scan line, the first part of the signal line intersecting with the first section and the second section of the scan line and the first capacitor wiring;

a first electrode and a second electrode facing each other with the second part of the signal line positioned therebetween;

a first pixel electrode electrically connected to the first electrode;

a second pixel electrode electrically connected to the second electrode; and a semiconductor film under and in contact with the second part of the signal line, the first electrode, and the second electrode, wherein the first capacitor wiring has a first region fully overlapped with the first part of the signal line, the first region comprising all area of first capacitor wiring overlapped with the signal line, wherein a full width of the first region of the first capacitor wiring is smaller than a full width of each of the first section and the second section of the scan line along the second direction, and wherein the semiconductor film overlaps with the first opening, the first section, the second section, and the third section of the scan line.

8. The display device according to claim 7, wherein the first section and the second section of the scan line are arranged in the second direction with the first opening positioned therebetween.

9. The display device according to claim 7, wherein each of the scan line and the first capacitor wiring comprises a stacked layer using metal material selected from molybdenum, titanium, chromium, tantalum, tungsten, aluminum, copper, neodymium, scandium, and nickel.

10. The display device according to claim 7, wherein each of the signal line, the first electrode, and the second electrode comprises a stacked layer using metal material selected from molybdenum, titanium, chromium, tantalum, tungsten, aluminum, copper, neodymium, scandium, and nickel.

11. The display device according to claim 7, wherein the semiconductor film comprises amorphous silicon.

12. The display device according to claim 7, wherein the first electrode is electrically connected to the first capacitor wiring.

13. A display device comprising:

a scan line having at least a first opening, a second opening adjacent to the first opening, a first section and a second section provided on respective sides adjacent to the first opening, and a third section located between the first opening and the second opening;

a first capacitor wiring and a second capacitor wiring each extending in parallel to the scan line;

a signal line having a first part intersecting with the first section and the second section of the scan line, the first capacitor wiring, and the second capacitor wiring, the signal line having a second part projected from the first part of the signal line, the second part of the signal line overlapping with the first opening of the scan line;

a first electrode and a second electrode facing each other with the second part of the signal line positioned therebetween;

a first pixel electrode electrically connected to the first electrode;

a second pixel electrode electrically connected to the second electrode; and a semiconductor film under and in contact with the second part of the signal line, the first electrode, and the second electrode, wherein each of the first capacitor wiring and the second capacitor wiring has a first region fully overlapped with the first part of the signal line, the first region of each of the first capacitor wiring and the second capacitor wiring respectively comprising all area of the first capacitor wiring overlapped with the signal line and all area of the second capacitor wiring overlapped with the signal line, wherein a full width of each of the first regions of the first capacitor wiring and the first region of second capacitor wiring is smaller than a full width of each of the first section and the second section of the scan line along an extending direction of the first part of the signal line, and wherein the semiconductor film overlaps with the first opening, the first section, the second section, and the third section of the scan line.

14. The display device according to claim 13, wherein the first opening of the scan line is positioned between the first section and the second section of the scan line.

15. The display device according to claim 13, wherein each of the scan line, the first capacitor wiring, and the second capacitor wiring comprises a stacked layer using metal material selected from molybdenum, titanium, chromium, tantalum, tungsten, aluminum, copper, neodymium, scandium, and nickel.

16. The display device according to claim 13, wherein each of the signal line, the first electrode, and the second electrode comprises a stacked layer using metal material selected from molybdenum, titanium, chromium, tantalum, tungsten, aluminum, copper, neodymium, scandium, and nickel.

17. The display device according to claim 13, wherein the semiconductor film comprises amorphous silicon.

18. The display device according to claim 13, wherein the first electrode is electrically connected to the first capacitor wiring, and wherein the second electrode is electrically connected to the second capacitor wiring.

* * * * *